US006586818B1

United States Patent
Voldman

(10) Patent No.: US 6,586,818 B1
(45) Date of Patent: Jul. 1, 2003

(54) SELF-ALIGNED SILICON GERMANIUM HETEROJUNCTION BIPOLAR TRANSISTOR DEVICE WITH ELECTROSTATIC DISCHARGE CREVICE COVER FOR SALICIDE DISPLACEMENT

(75) Inventor: Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/683,986

(22) Filed: Mar. 8, 2002

(51) Int. Cl.[7] ............... H01L 29/80; H01L 31/112; H01L 31/0288
(52) U.S. Cl. ............ 257/587; 257/198; 438/312; 438/320; 438/353
(58) Field of Search ................ 257/12, 19, 47, 257/183, 187, 197, 198, 200, 273, 301, 350, 361, 370, 373, 378, 382, 413, 477, 517, 526, 552, 554, 556, 557, 558, 565, 576, 587, 588, 592, 739, 776, 759; 438/47, 170, 172, 191, 203, 234–236, 309, 312, 313, 315, 317, 320–322, 324, 326, 329, 331, 337, 341, 343, 347, 350, 353, 359, 360, 364, 365, 366, 489, 532, 555

(56) References Cited
U.S. PATENT DOCUMENTS 5,282,925 A   2/1994   Jeng et al.
5,424,227 A   6/1995   Dietrich et al.
5,502,330 A   3/1996   Johnson et al.
5,583,059 A   12/1996  Burghartz
5,587,327 A   12/1996  Konig et al.
5,616,508 A   4/1997   Johnson
5,620,907 A   4/1997   Jalali-Farahani et al.
5,629,556 A   5/1997   Johnson
5,773,350 A   6/1998   Herbert et al.
5,821,149 A   10/1998  Schuppen et al.
5,834,800 A   11/1998  Jalali-Farahani et al.
5,925,923 A   7/1999   Blair
6,171,894 B1  1/2001   Laurens
6,455,902 B1 * 9/2002   Voldman ............... 257/378
6,455,919 B1 * 9/2002   Brennan et al. ......... 257/616
6,465,870 B2 * 10/2002  Voldman ............... 257/565

* cited by examiner

Primary Examiner—Ernest Karlsen
Assistant Examiner—Asok Kumar Sarkar
(74) Attorney, Agent, or Firm—McGinn & Gibb, PLLC; Mark F. Chadurjian, Esq.

(57) ABSTRACT

A method and structure for a bipolar transistor with a semiconductor substrate having a surface and a shallow trench isolation (STI) in the surface. The STI has an edge, a crevice region in the STI adjacent the STI edge, a base region above the STI, a silicide above the base region, an emitter structure on the surface adjacent the base region, and a crevice cover between the emitter structure and the silicide. The crevice cover maintains spacing between the emitter structure and the silicide.

20 Claims, 18 Drawing Sheets

US 6,586,818 B1

SELF-ALIGNED SILICON GERMANIUM HETEROJUNCTION BIPOLAR TRANSISTOR DEVICE WITH ELECTROSTATIC DISCHARGE CREVICE COVER FOR SALICIDE DISPLACEMENT

BACKGROUND OF THE INVENTION

1. Field of the Invention

The present invention generally relates to silicon germanium (SiGe) technology, and more particularly to a silicon germanium carbon heterojunction bipolar transistor (SiGeC HBT) for use in various electronic devices.

2. Description of the Related Art

Silicon Germanium (SiGe) technology has become mainstream in today's RF (radio frequency) applications, high speed wired data transmission, test equipment, and wireless applications. Silicon germanium technology provides particular benefit to heterojunction bipolar transistors (HBTs). These transistors are commonly used in semiconductor devices for high-speed operation and large drive current applications. Such heterojunction bipolar transistors are increasingly being used for applications in extremely high frequency range technologies such as communications and satellite circuitry.

A fundamental requirement of device integration in silicon is the electrical isolation of devices. Typically, resistances and capacitances associated with possible isolation schemes scale with technology. This means that as device geometries decrease, so do the isolation valves (e.g. resistance to electrostatic discharge (ESD)) of the isolation structures.

Accordingly, a need has developed in the art for HBT isolation structures that retain good resistance to ESD events.

BRIEF SUMMARY OF THE INVENTION

Accordingly, it is an object of the present invention to provide improved isolatin for heterojunction bipolar transistor device.

In order to attain the object(s) suggested above, there is provided, according to one aspect of the invention, a bipolar transistor on a semiconductor substrate having a surface, comprising a shallow trench isolation (STI) in the surface, the STI having an edge; a crevice region in the STI adjacent the STI edge; a base region above the STI; a silicide above the base region; an emitter structure on the surface adjacent the base region; and a crevice cover between the emitter structure and the silicide. The crevice cover prevents substantial variation in resistance of the bipolar transistor, by preventing the silicide from extending over the crevice region. The base is spaced toward the emitter structure from the crevice region. The silicide has a resistance independent of variations in the base and the emitter structure.

The invention not only increases the spacing between the silicide and the base-to-emitter region, but also improves the silicide formation to move the silicide out of the crevice region to further improve ESD robustness. Further, the silicide has a resistance that is independent of variations in the structure of the base or the emitter structure.

The invention forms a bipolar transistor which forms a shallow trench isolation (STI) in a substrate. The STI having an edge, such that a crevice region is formed in the STI adjacent the STI edge, simultaneously growing a base region above the STI and a semiconductor of an emitter structure on the substrate adjacent the STI, forming conductors of the emitter structure above the semiconductor, forming a crevice cover on the base region adjacent the emitter structure and saliciding an upper layer of the base region and adjacent the crevice cover to produce a silicide, that includes the crevice cover maintains spacing between the emitter structure and the silicide.

BRIEF DESCRIPTION OF THE SEVERAL VIEWS OF THE DRAWINGS

The foregoing and other objects, aspects and advantages will be better understood from the following detailed description of a preferred embodiment(s) of the invention with reference to the drawings, in which.

DETAILED DESCRIPTION OF THE INVENTION

Figure 1:
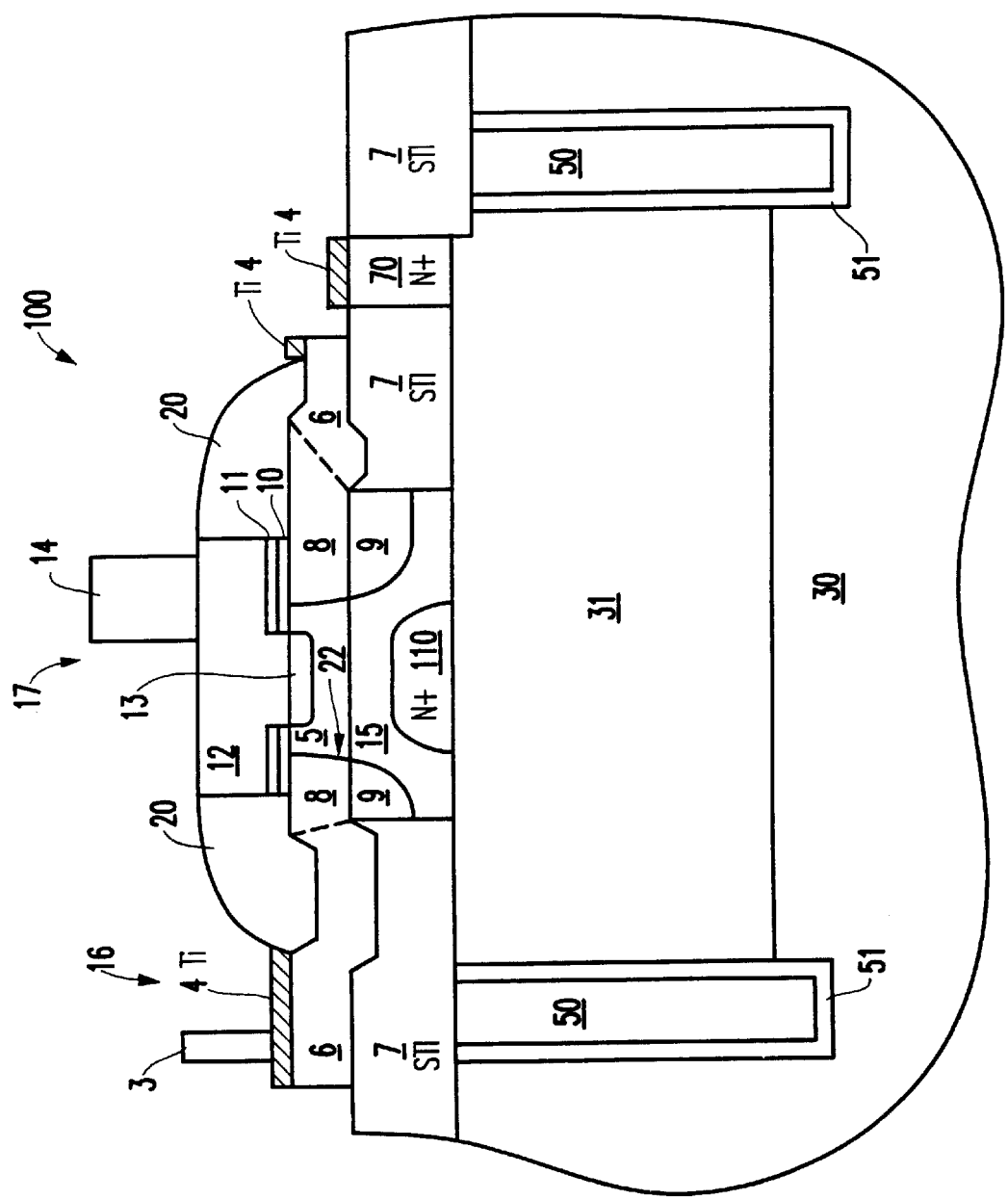
FIG. 1 is a schematic diagram of a partially-completed bipolar transistor according to the invention.

As mentioned above, electrostatic discharge robustness of self-aligned silicon germanium hetrojunction bipolar transistor devices is important for receiver networks. A novel heterojunction bipolar transistor is shown in FIG. 1. Specifically, FIG. 1 shows a cross-sectional view of a SiGeC HBT structure. The transistor device 1 is formed on a P-type substrate having a N-type region 31. Storage trench capacitors 50, 51 are positioned on each side of the structure. The transistor has a base region 16, an emitter region 17, and a collector 15. Within the collector 15 is a more heavily N+ doped region 110 which is doped similarly to an adjacent N+ region 70 within the shallow trench isolation (STI) region 7. The base region 16 includes a base contact 3 disposed on a silicide film 4 which is made of any refractory metal, such as titanium or cobalt. The silicide film 4 is formed within the upper surface of a conductive amorphous polysilicon germanium carbon film 6 which lies over the shallow trench isolation (STI) region 7. Adjacent the shallow trench isolation region 7 is a P+ dopant implant 8, 9. Between the collector 15 and the emitter 12, 13 lies the semiconductor base region 5 which comprises a single crystal silicon germanium carbon semiconductor.

The carbon in the semiconductor region 5 minimizes boron diffusion. Together, the contact 3, silicide film 4, and SiGeC film 6 form the extrinsic base structure 16. Preferably, the use of the carbon dopant allows dramatic increases in the amount of boron such that the base 5 has a sheet resistance of less than approximately 4 Kohms/cm$^2$.

More specifically, this structure uses a doping concentration (e.g., boron) of approximately $1 \times 10^{10}$ cm$^3$, while conventional structures/processes are limited to approximately $1 \times 10^6$ cm$^3$. This produces peak concentrations of $1 \times 10^{21}$ cm$^3$ of the dopant. This allows the base 5 to have a substantially reduced sheet resistance (4 Kohm/cm$^2$) when compared to the sheet resistance (10 Kohm/cm$^2$) of conventional base structures. These higher concentrations of dopant do not detrimentally affect the structure because the carbon included within the base layer 5 prevents substantial dopant outdiffusion.

The emitter region 17 is formed over the semiconductor 5. Insulator layers 10, 11 isolate the base region 16 from the emitter region 17, which prevents the emitter 12 from shorting to the base region 16. Insulator layer 10 is preferably silicon dioxide, while insulator layer 11 is preferably silicon nitride. The emitter region 17 preferably includes a conductive polysilicon film 12 which is N+ doped. After the emitter region 12 is heat cycled, an N+ doped diffusion 13 is created in the SiGeC film 5. Additionally, an emitter contact 14 is disposed on the polysilicon film 12. The base-emitter junction is shown as item 22 and generally resides along the border of the semiconductor 5 and the conductive P-doped region 8.

The device 1 operates by forming an electrical connection (increasing conductivity of the semiconductor 5) between the collector 15 and the contact 14 of the emitter 17 (through polysilicon 12 and diffusion 13) when a base current is injected into the base 5 (through contact 3, silicide 4, polysilicon 6, and conductive doped region 8). The device 1 operates as does a conventional heterojunction bipolar transistor device; however, the invention yields a device having much greater performance.

More specifically, an increase in performance is seen by including carbon in the single crystal silicon germanium layer 5 which allows the size of the boron diffusion within the semiconductor layer 5 to be much more strictly controlled. The carbon bonds with the boron, thereby limiting its diffusion movement and maintaining a much tighter distribution of the boron atoms within a smaller area of the semiconductor layer 5. This increases operating speed, breakdown voltages, permits greater scaling (size reduction), and allows increased dopant concentrations, which reduces sheet resistance.

In addition, carbon is a smaller atom than germanium, and bonds with the silicon to reduce the strain within the entire silicon germanium layer 5, 6. Therefore, the invention avoids misfit dislocations (cracks) which are caused by excessive strain. Because of the strain reduction produced by carbon, the probability of strain-related cracking (dislocations) is substantially reduced in the silicon germanium layer 5, 6.

Figure 19:
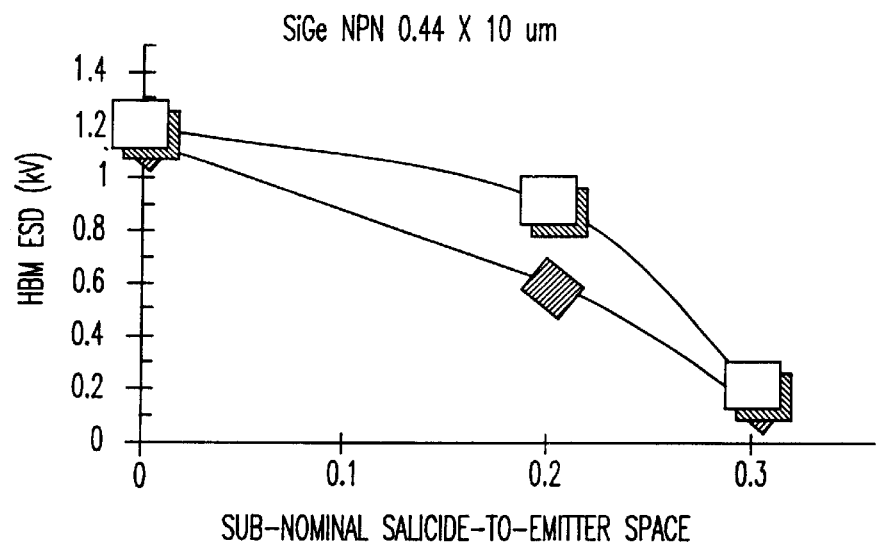
FIG. 19 is a chart showing the decrease in the HBM results as the silicide infringes on the emitter.

The sensitivity of the base-emitter junction 22 is important to ESD sensitivity. The sensitivity of the base-emitter junction is a function of the extrinsic base-to-emitter spacing and placement of the silicide 4 relative to the emitter-base junction 22. As the silicide-to-emitter space decreases, the ESD robustness of the transistor decreases. FIG. 19 shows the decrease in the HBM results as the silicide infringes on the emitter.

The ESD results decrease for three reasons. First, the high current flows through the silicide film causing high current density due to the small cross-sectional area. This produces high self-heating in the film, leading to film failure. Second, it brings the region of high density closer to the emitter; hence, the peak temperature is closer to the emitter since self-heating peak temperature occurs in the region of peak current density and peak electrical field. Third, as the material heats, the silicide can penetrate into the silicon. This leads to ESD failure.

The curves in FIG. 19 show that, as the silicide impinges on the emitter, the ESD results decrease.

The invention overcomes the ESD problems associated with an undersized base-to-emitter junction 22 by including an emitter crevice cover 20 as shown in FIG. 1. The crevice cover 20 provides additional spacing for the silicide 4. By moving the silicide back, the HBM ESD robustness is improved. The crevice cover 20 increases the distance between the silicide 4 and the emitter structure 5, 13, 12. The increased physical distance provided by the emitter crevice cover 20 substantially reduces the ESD problems discussed above.

Figure 7:
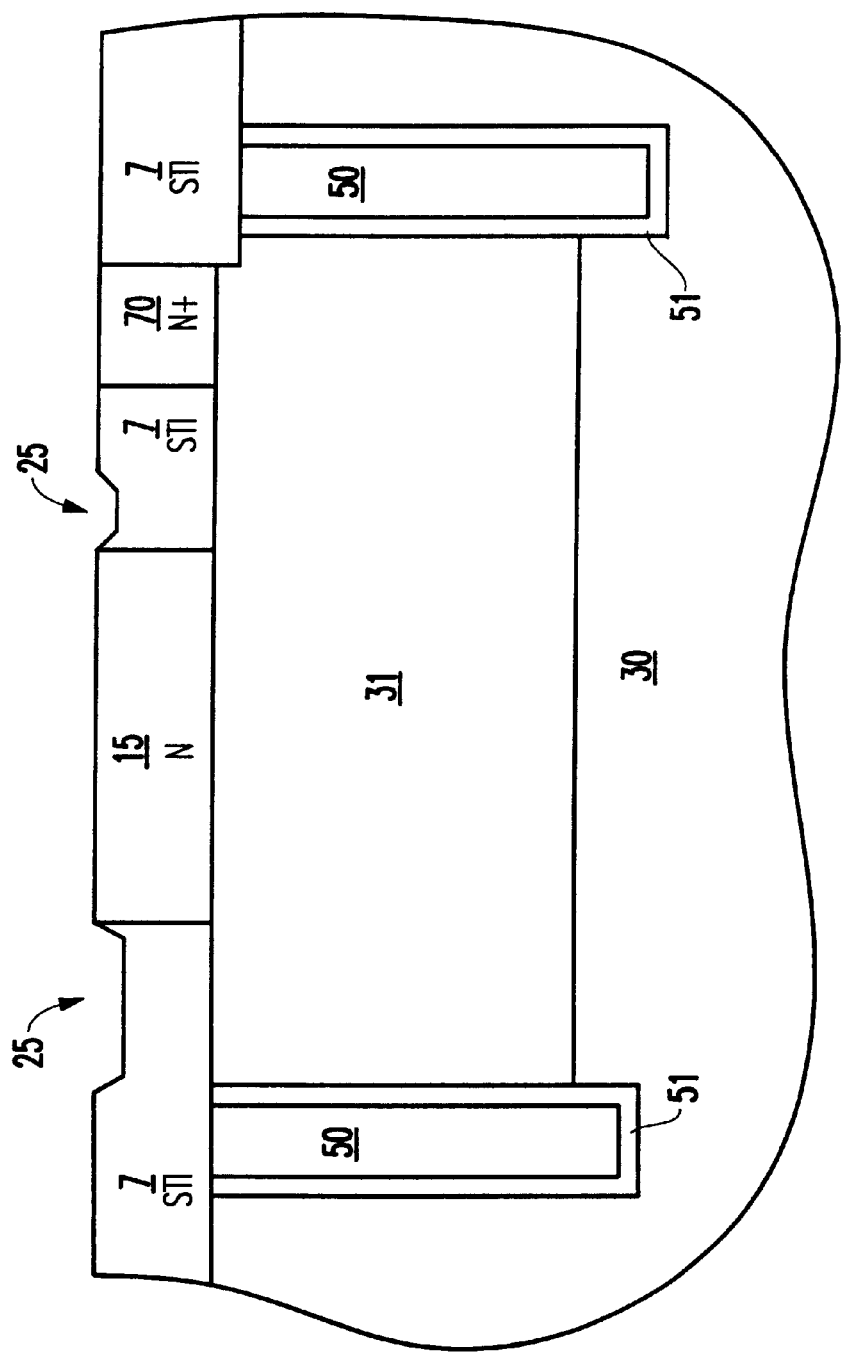
FIG. 7 is a schematic diagram of a partially-completed bipolar transistor according to the invention.

In addition to the forgoing benefits, the invention also eliminates another problem relating to the silicide 4. In the self-aligned transistor, a crevice 25 is introduced in the emitter base region of the transistor. This crevice 25 (FIG. 7) is introduced in the STI 7 shape so that the facet 22 formed between the poly silicon silicon germanium 6 and the single crystal silicon germanium 5 angles toward the single crystal silicon germanium 5. However, a problem is created in that the crevice 25 causes a non-uniform extrinsic base region of topography. As a result, the silicide 4 may not uniformly form in the crevice region and "spotty silicide" is formed. If the region is not large enough, nucleation of the silicide will not form as well, and "breakage" in the film can occur, causing irregular electrical connectivity of the silicide film.

Thus, the presence of the crevice can introduce irregular topography, impose limitations on the emitter poly dimension, introduce a breakage in the silicide film, and introduce a region of non-transformed silicide (which is not well-controlled).

The invention solves this problem by using the emitter crevice cover 20 over the emitter polysilicon. By having the crevice cover 20 extend over the crevice region 25, the crevice cover 20 defines the region of silicide formation 4 to prevent such silicide irregularities and to allow for a more uniform controlled device that produces more consistent fMAX values and more consistent (as well as higher) ESD results.

FIGS. 2–13 illustrate one set of processes that can be utilized to manufacture the inventive bipolar transistor shown in FIG. 1. However, the invention is not limited to the following set of processes. Instead, one ordinarily skilled in the art would understand that a number of other materials, conditions, processing steps, etc., could be utilized to achieve the same results. Thus, the invention is broadly applicable to all similar processes. Processes which are well-known to those ordinarily skilled in the art are not discussed in detail so as to not obscure the salient features of the invention.

Figure 2:
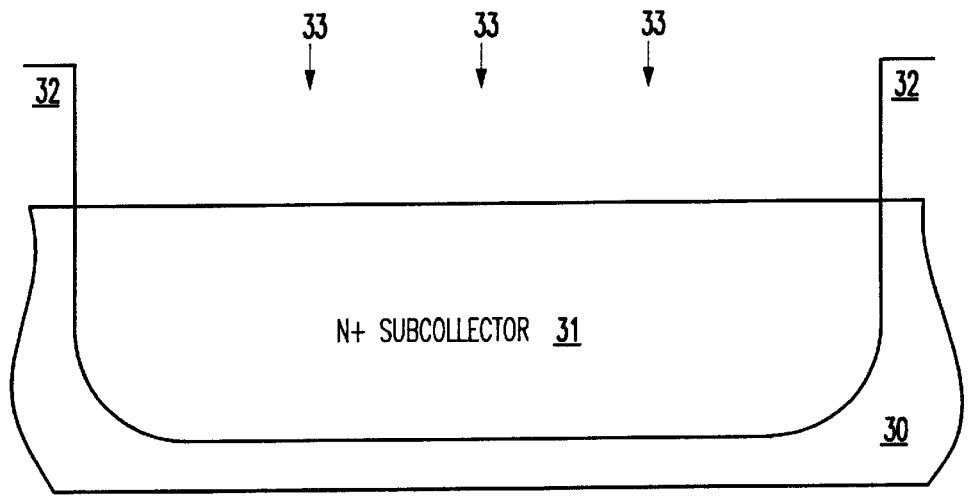
FIG. 2 is a schematic diagram of a partially-completed bipolar transistor according to the invention.
Figure 3:
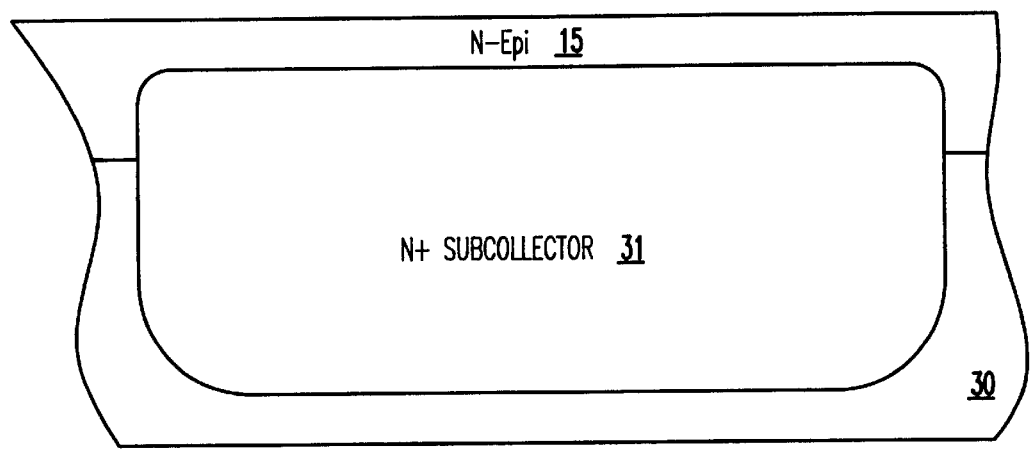
FIG. 3 is a schematic diagram of a partially-completed bipolar transistor according to the invention.
Figure 4:
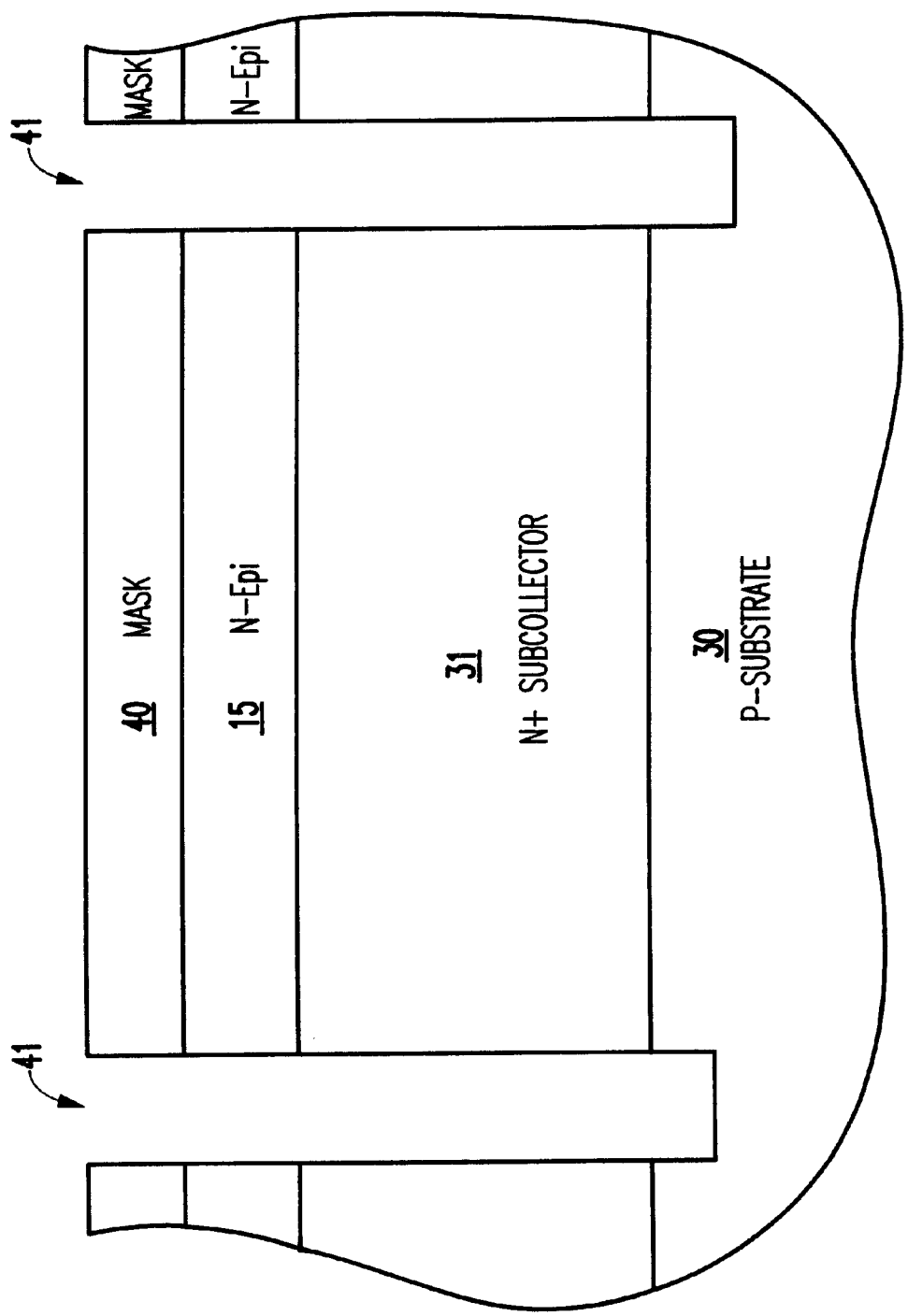
FIG. 4 is a schematic diagram of a partially-completed bipolar transistor according to the invention.

More specifically, FIG. 2 illustrates a P-type substrate 30 and a mask 32 that is used to dope the substrate 30 with N+ dopant to form the subcollector 31. In FIG. 3, a N-type epitaxially grown layer 15 is grown after the mask 32 is removed. A patterned mask 40 is formed using conventional techniques (e.g., photolithography, etc.) over the epitaxial layer 15, as shown in FIG. 4. The mask 40 is used in an etching process to form openings 41 for trench capacitors on each side of the subcollector 31.

Figure 5:
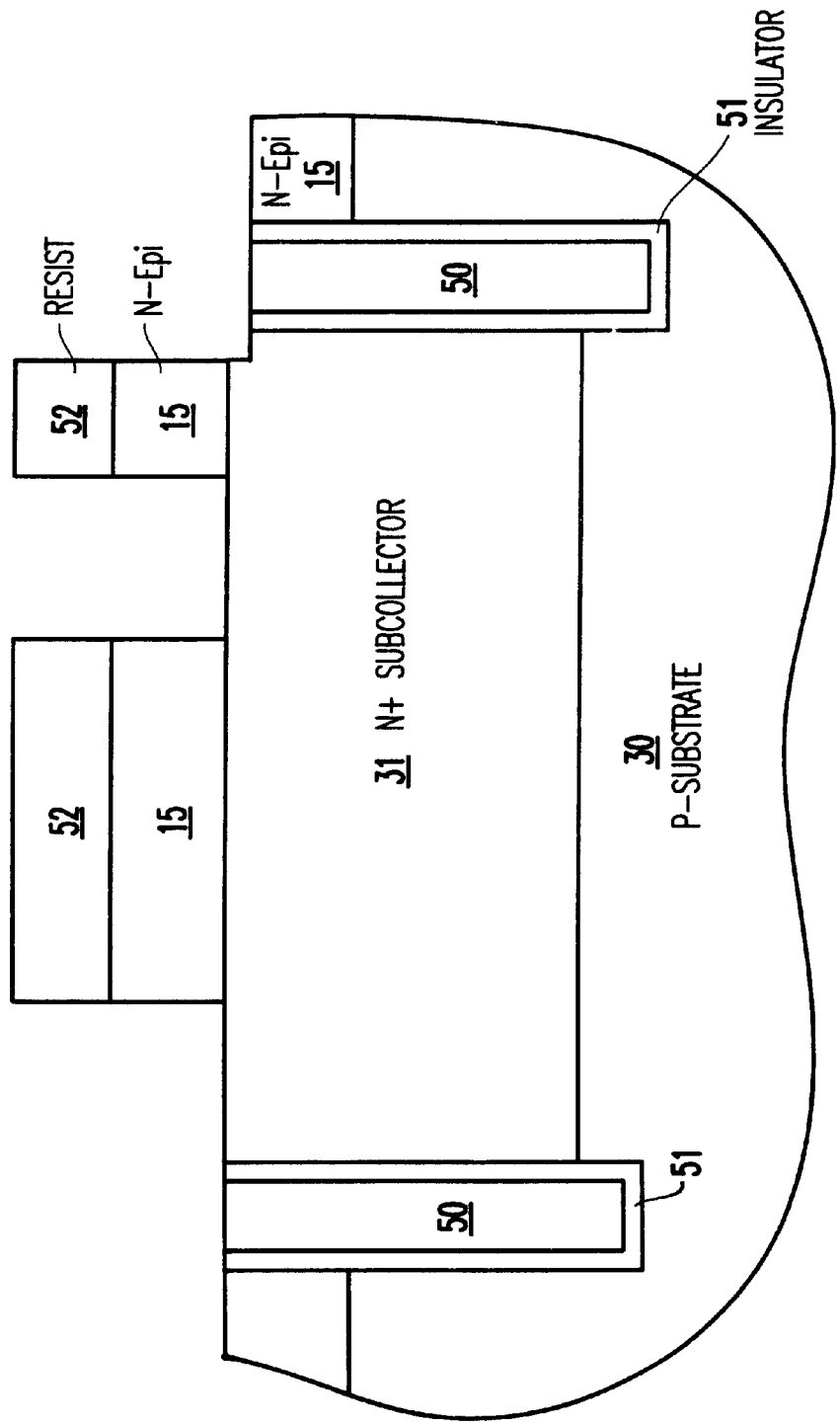
FIG. 5 is a schematic diagram of a partially-completed bipolar transistor according to the invention.

In FIG. 5, a trench insulator 50 is used to line the trench openings 41 and the trenches are filled with a conductor 50 (e.g., polysilicon). The first mask 40 is removed and another mask 52 is patterned over the structure using similar mask formation processes. Another etching process is used to pattern the epitaxial layer 15 under the mask 52. This etching process is selective, such that the N+ subcollector 31 and the trench capacitor are not effected. The epi 15 is formed first, and then the trench 41 is cut through the epi region.

Figure 6:
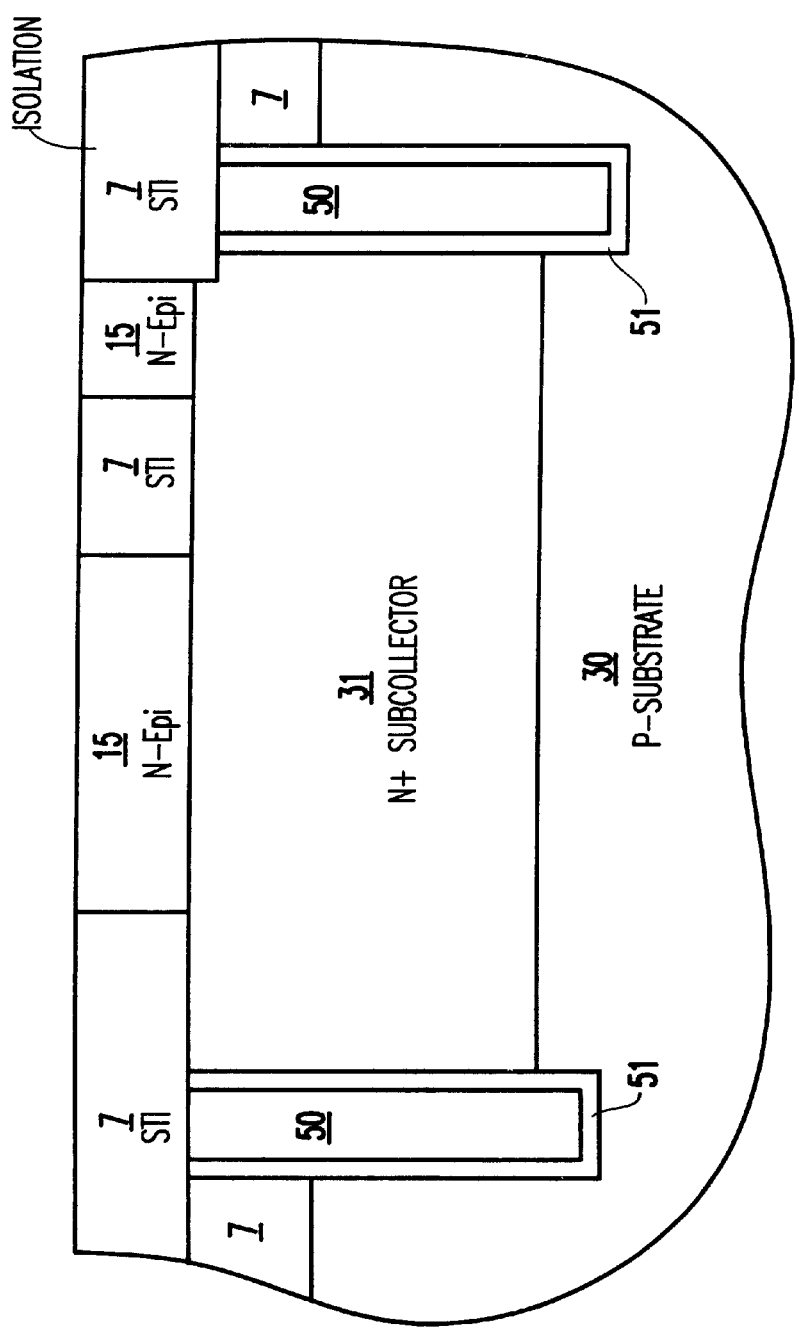
FIG. 6 is a schematic diagram of a partially-completed bipolar transistor according to the invention.

The mask 52 is removed and a shallow trench isolation 7 material (e.g., BEOL) is deposited over the structure which is then planarized using conventional, well-known processes (e.g, chemical-mechanical polishing, etc.) as shown in FIG. 6. A mask (not shown) is then used to selectively implant a reach-through implant to more heavily dope a portion of the epitaxial layer 15 to form the N+ region 70 shown in FIG. 7. In addition, another mask (not shown) is used to form crevices 25 in the shallow trench regions 7.

Figure 8:
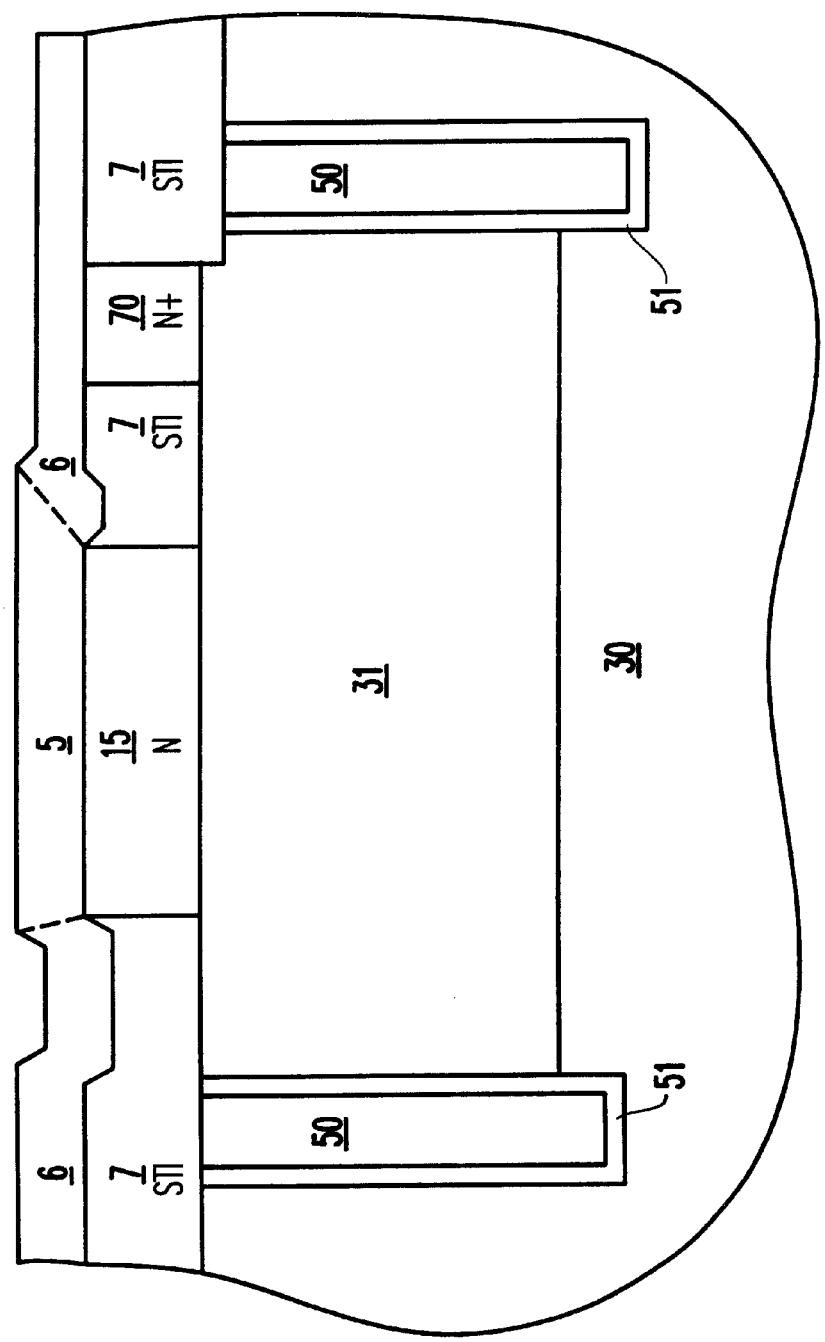
FIG. 8 is a schematic diagram of a partially-completed bipolar transistor according to the invention.

An epitaxial growth process is then used to grow a silicon germanium carbon layer (in concentrations such as those discussed above) above the collector region 15, as shown in FIG. 8 The area above the shallow trench isolation region forms as a polysilicon germanium carbon layer 6, while the area above collector region 15 forms a single crystal silicon germanium carbon layer 5 during such an epitaxial growth process. While silicon germanium carbon is shown in this example, the semiconductor could also comprise any conventional semiconductor doped with carbon.

Figure 9:
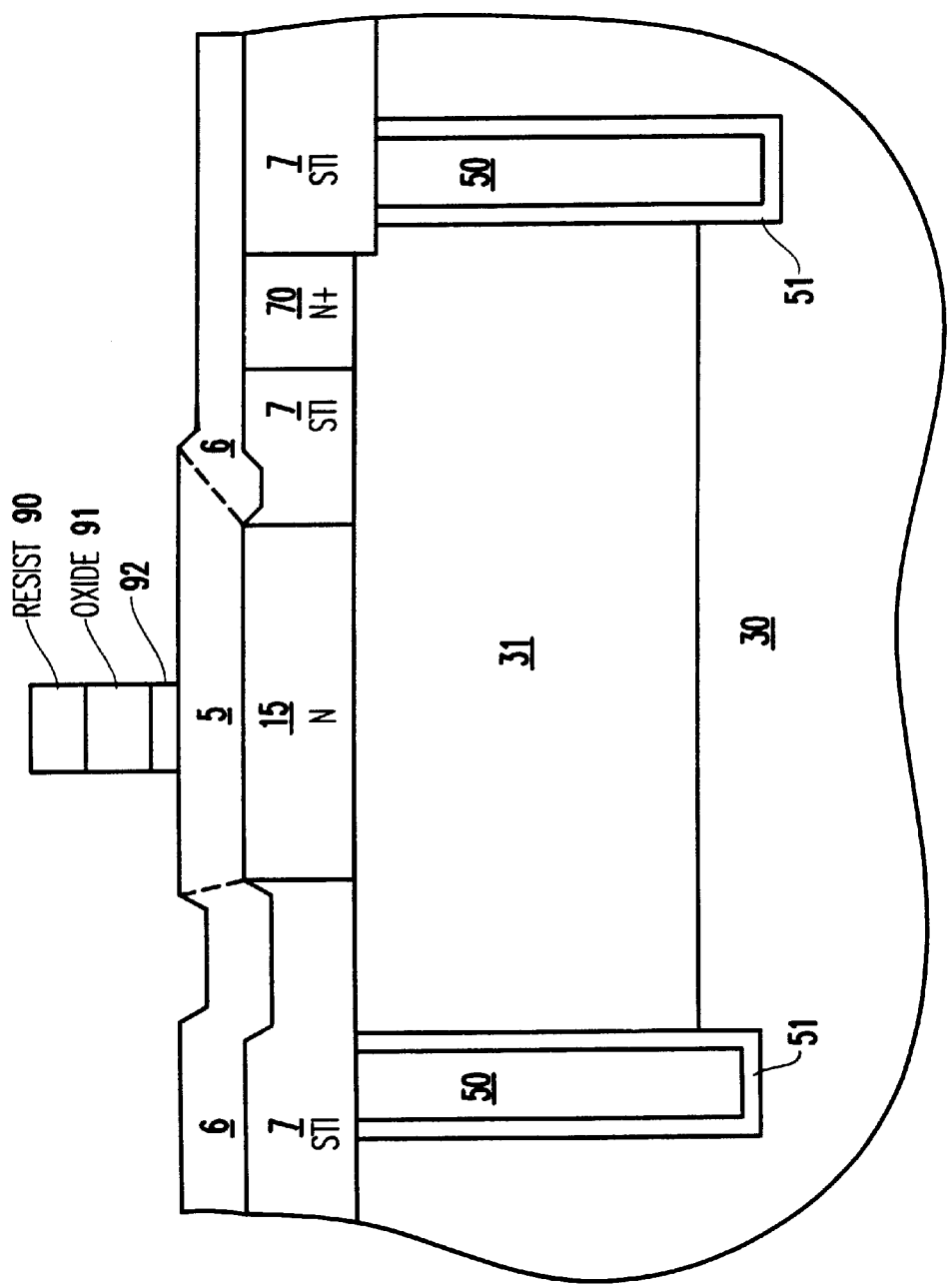
FIG. 9 is a schematic diagram of a partially-completed bipolar transistor according to the invention.
Figure 10:
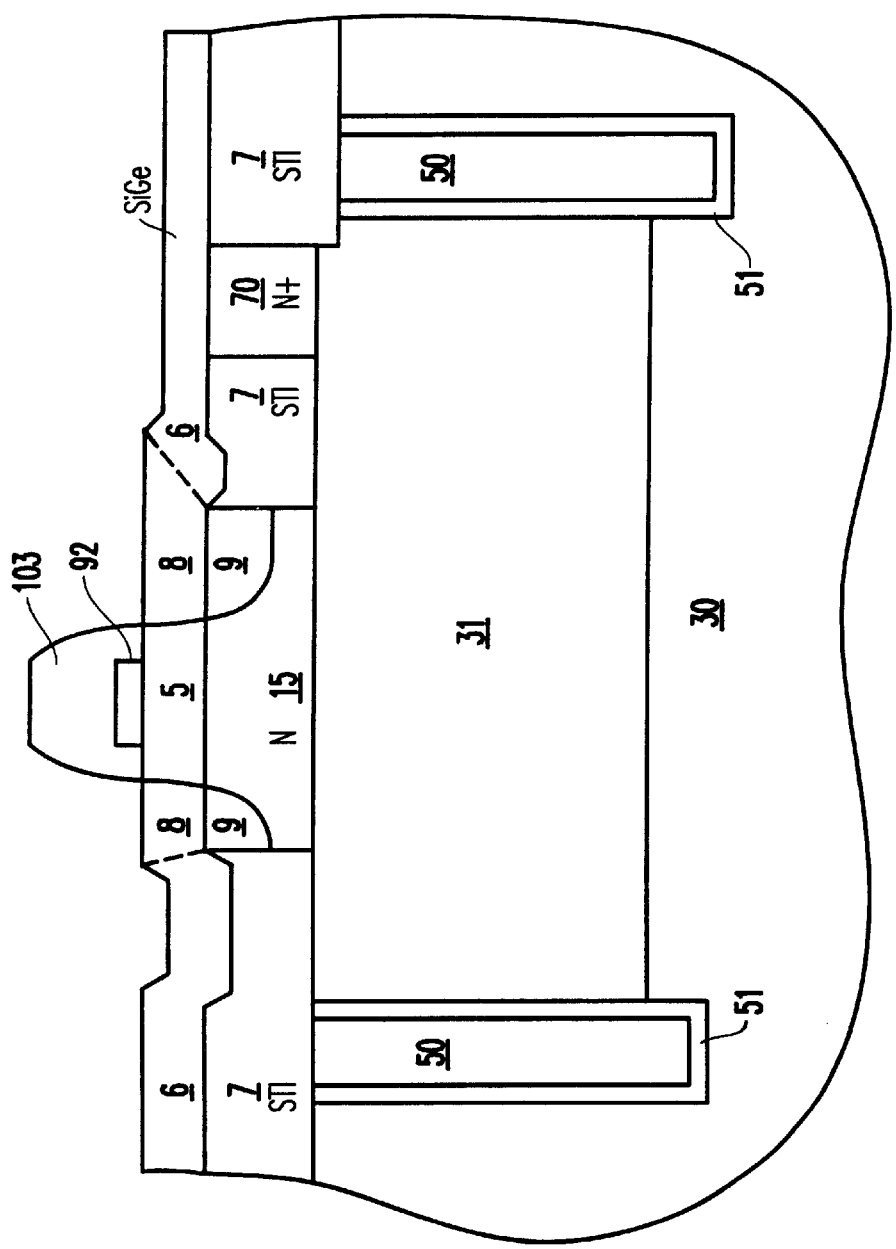
FIG. 10 is a schematic diagram of a partially-completed bipolar transistor according to FIG. 11 is a schematic diagram of a partially-completed bipolar transistor according to the invention.
Figure 11:
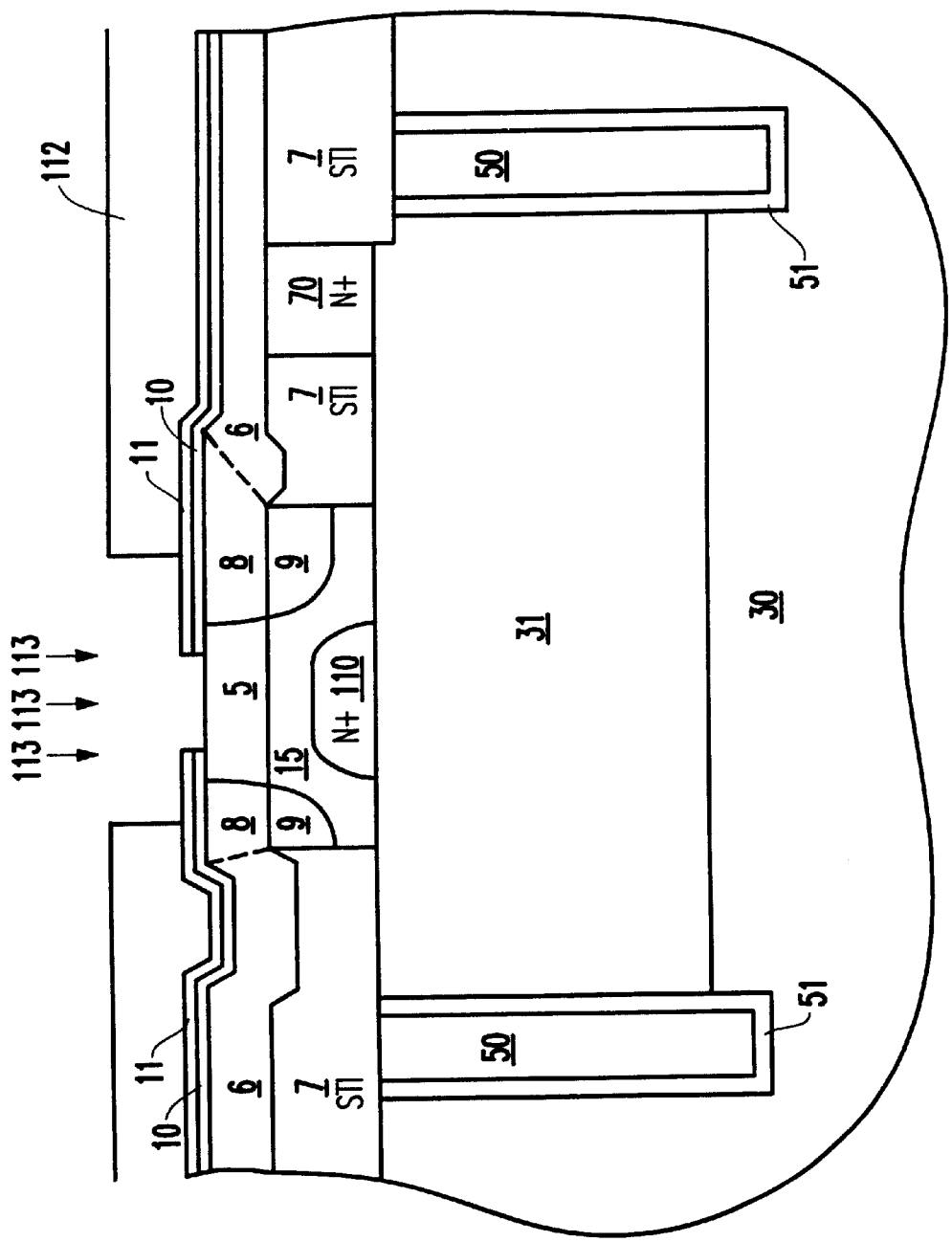

In FIG. 9, an insulator layer 92 and an oxide 91 are then patterned using a mask 90 over the collector 15, using well-known conventional processes. Another mask 103 is patterned over the structure 92 and an implant process is performed, as shown in FIG. 10. The impurity is preferably boron (in concentrations such as those discussed above) and forms impurity regions 8 and 9. The impurity could also be any other type of P-type impurity, such as boron, aluminum, gallium, indium and/or titanium. In FIG. 11, a series of insulators (e.g., a nitride film 10, and an oxide film 11) are formed and patterned. Another mask 112 is formed and a pedestal implant 113 is used to form a N+ base region 110 in the base 15.

Figure 12:
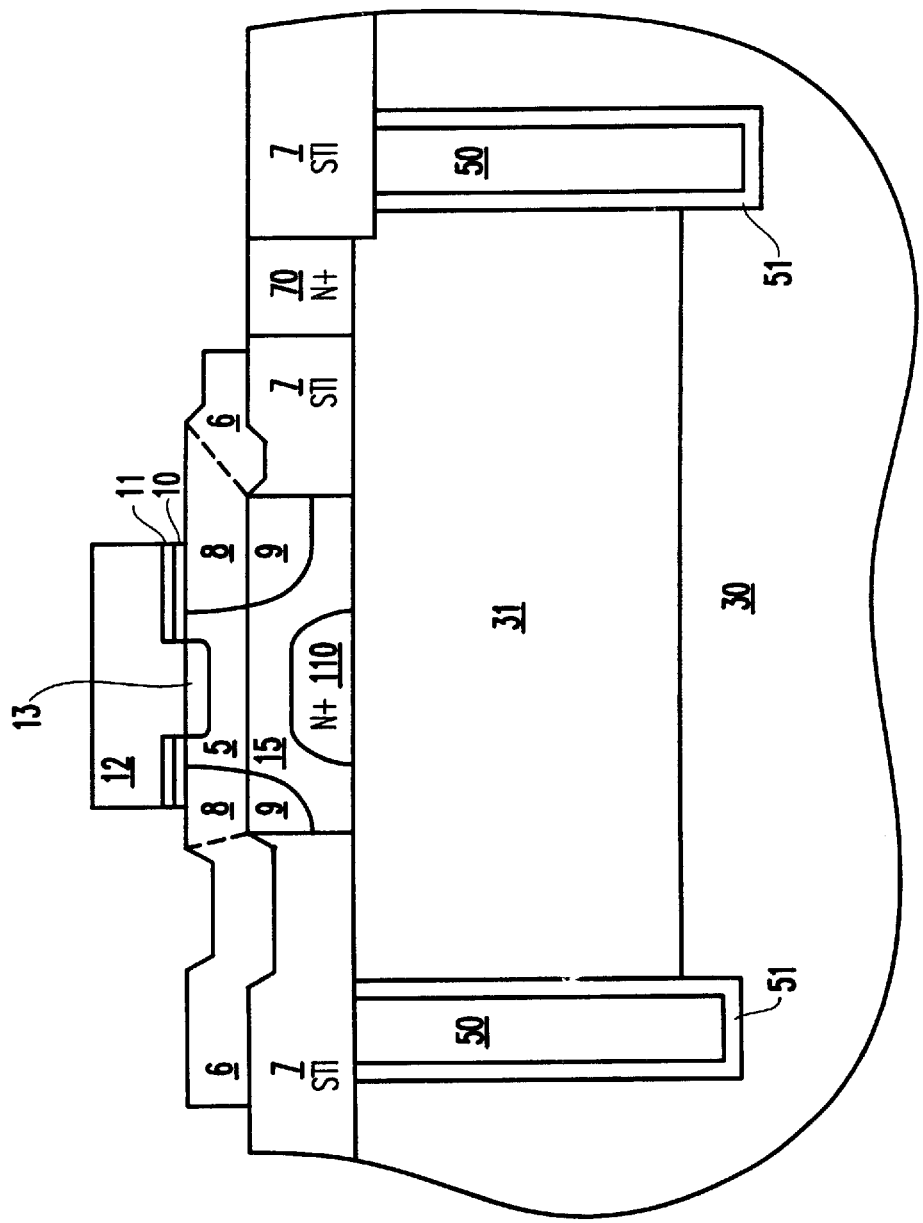
FIG. 12 is a schematic diagram of a partially-completed bipolar transistor according to the invention.
Figure 13:
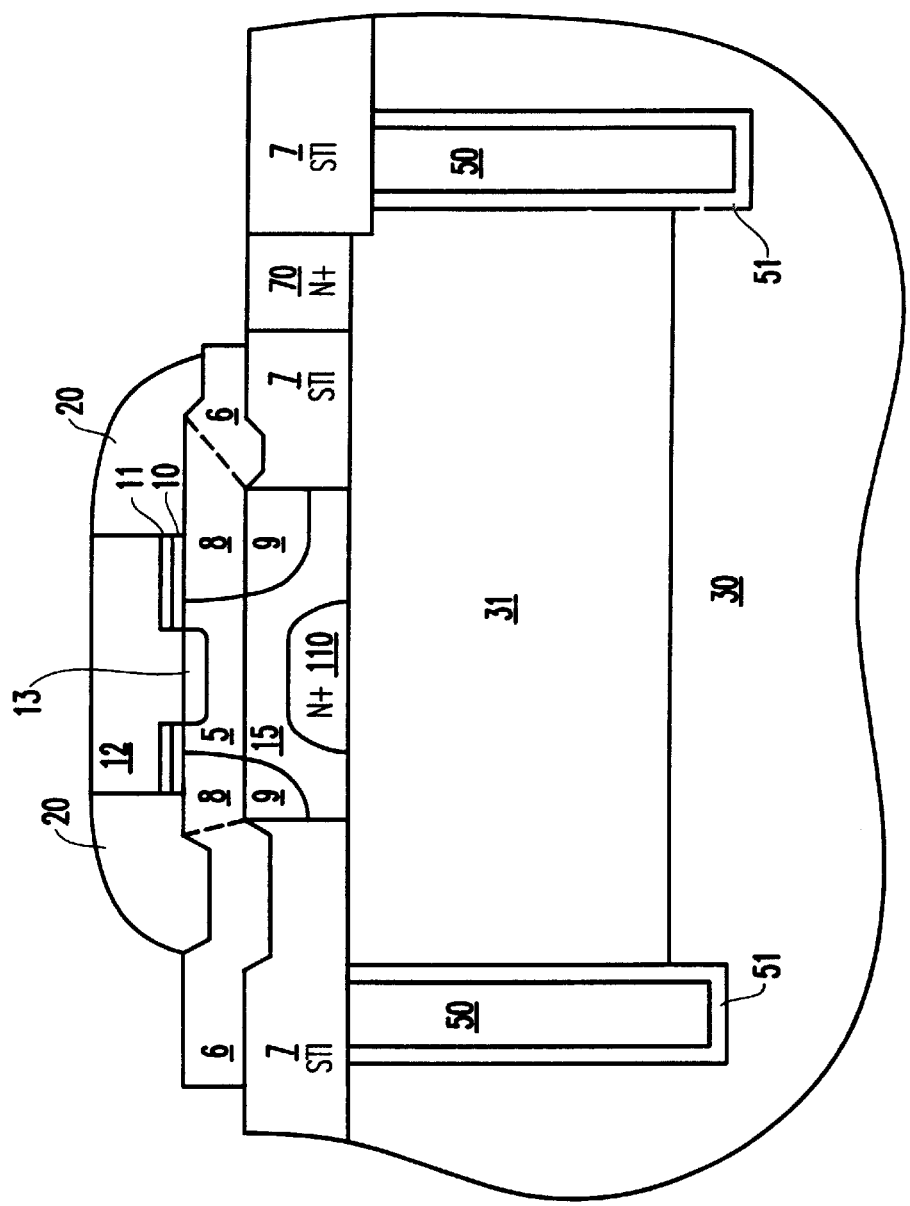
FIG. 13 is a schematic diagram of a partially-completed bipolar transistor according to the invention.

Using similar processing, a layer of polysilicon 12 is deposited and patterned, and the outer portions of the polysilicon layer 6 are removed, as shown FIG. 12. The structure is then subjected to an annealing process. The polysilicon 12 is preferably doped with an impurity, which diffuses to create diffusion region 13 within the single crystal silicon germanium carbon layer 5, during the annealing process, as shown in FIG. 12. Alternatively, the diffusion region 13 could be formed in a separate, patterned, self-aligned implantation process before the polysilicon 12 is formed. In addition, during the annealing process, the dopant 8 (e.g., boron) will diffuse laterally (not horizontally) throughout the entire lateral dimension of the epitaxial layer 5, 6, as is also shown in FIG. 12.

More specifically, to form the crevice cover 20, a layer of insulating material is deposited over the partially-completed transistor structure. This material could comprise any insulator. Then, the insulator is etched in an anisotropic etching process that removes material from horizontal surfaces at a substantially faster rate than it removes material from vertical surfaces. This allows the insulator 20 to remain along the sidewall of the emitter 12, 11, 10. This process of forming a crevice cover 20 along the emitter still allows a sufficient portion of the silicide 4 to be formed, yet also provides sufficient spacing between the silicide 4 and the base-to-emitter junction 22.

After the emitter crevice cover 20 is formed, the silicide 4 is formed above the polysilicon 6 using conventional well-known silicide processing to decrease resistance of the polysilicon 6, as shown in FIG. 1. As discussed above, the emitter crevice cover 20 prevents the silicide 4 from being formed close to the base-to-emitter junction 22, thereby avoiding the ESD problems discussed above. To complete the structure, conductive contacts 3, 14 are formed using well-known deposition and patterning processes. Processes necessary to complete, insulate, and connect the transistor to other devices within the circuit are well-known to those ordinarily skilled in the art and are not discussed herein.

Figure 14:
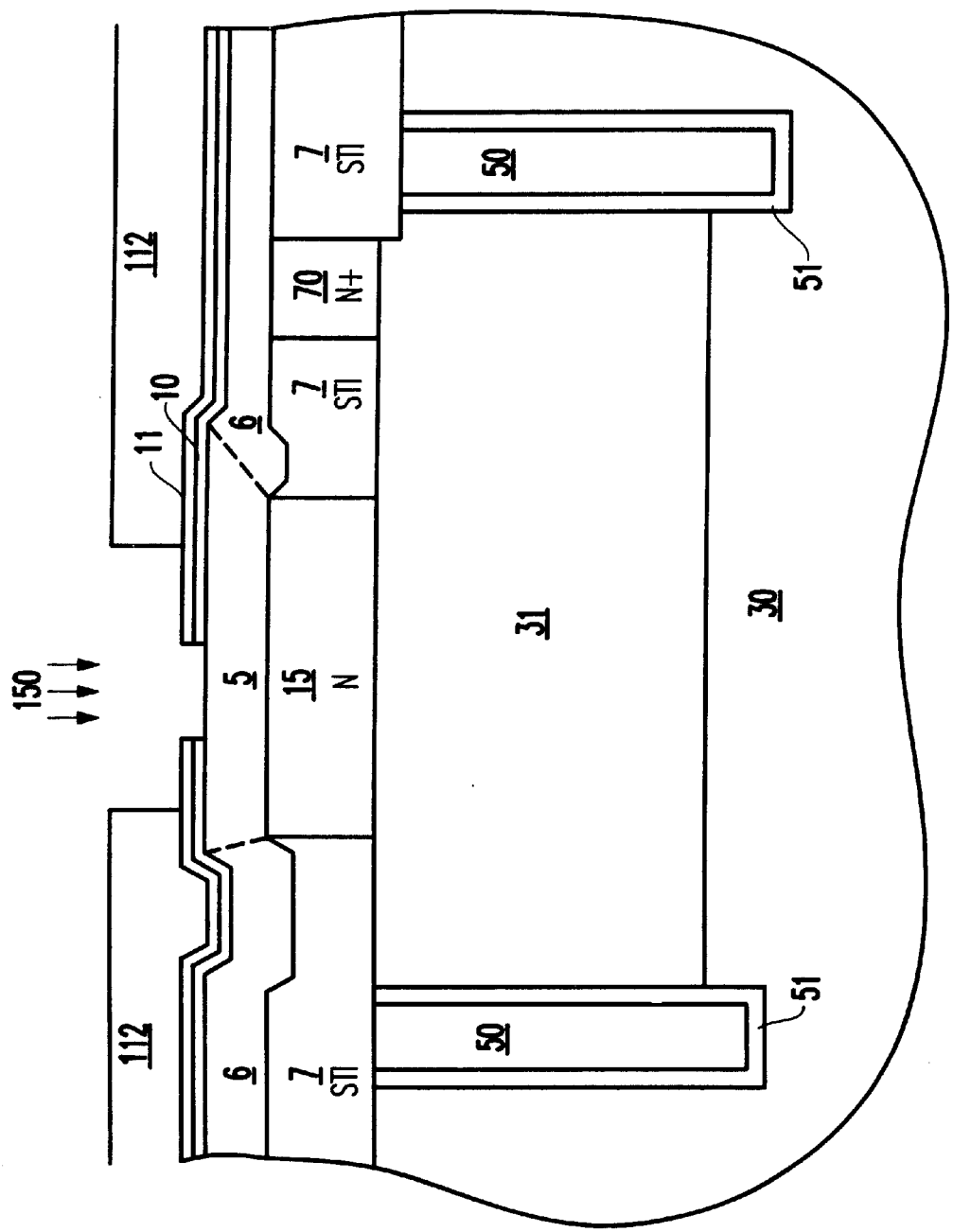
FIG. 14 is a schematic diagram of a partially-completed bipolar transistor according to a second embodiment of the invention.

The processing shown in FIGS. 2–13 is described as a self-aligned process because the extrinsic base implant is self-aligned to the emitter edge with a crevice cover. Another embodiment involves a process that is not self-aligned. More specifically, the structure shown in FIG. 14 begins with the structure shown in FIG. 11 except, instead of the pedestal implant 113, a different pedestal implant 150 is used. The implant 150 is done through the emitter window and is located only under the emitter window. The dopant of 150 does not have to be the same as 113.

Figure 15:
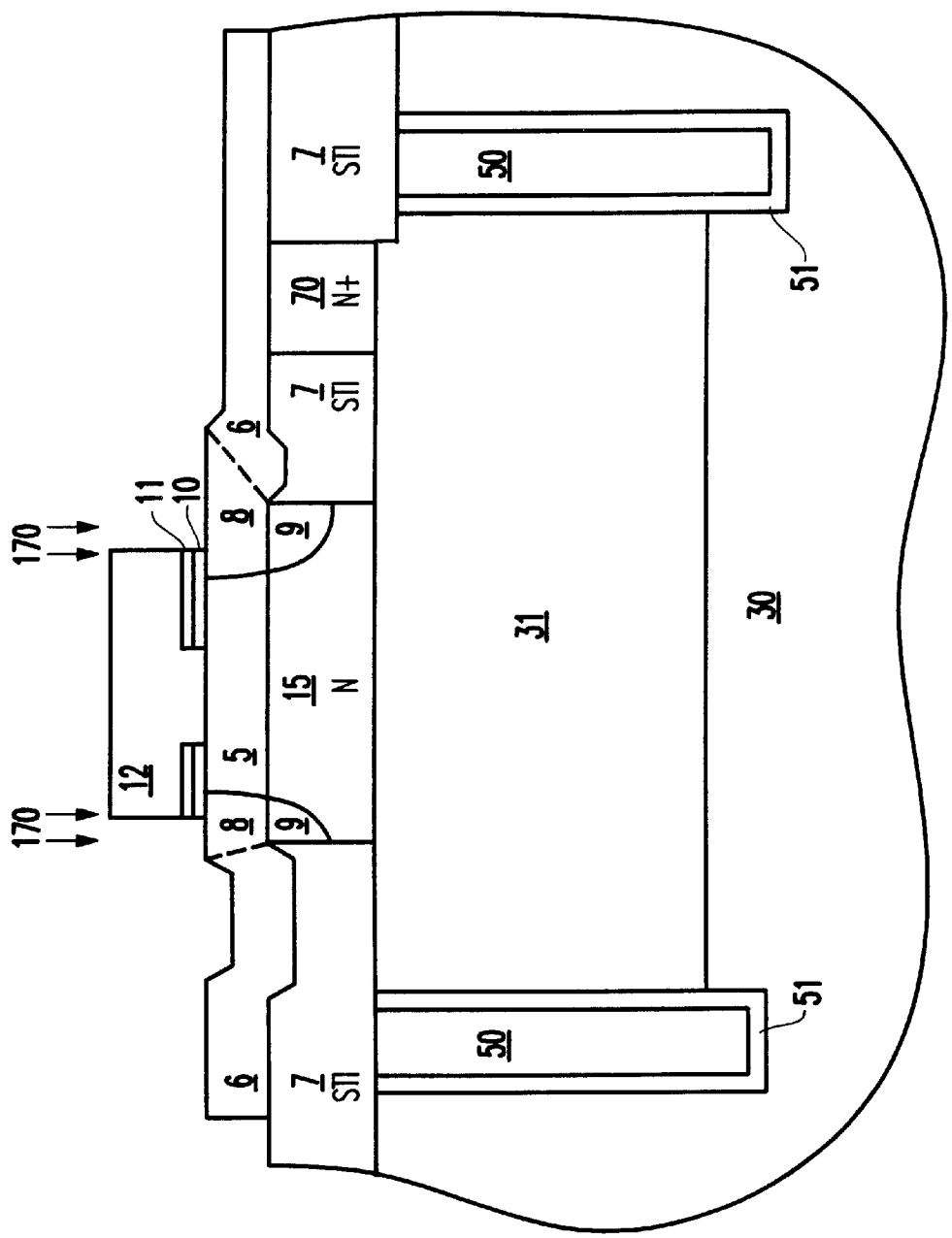
FIG. 15 is a schematic diagram of a partially-completed bipolar transistor according to a second embodiment of the invention.
Figure 16:
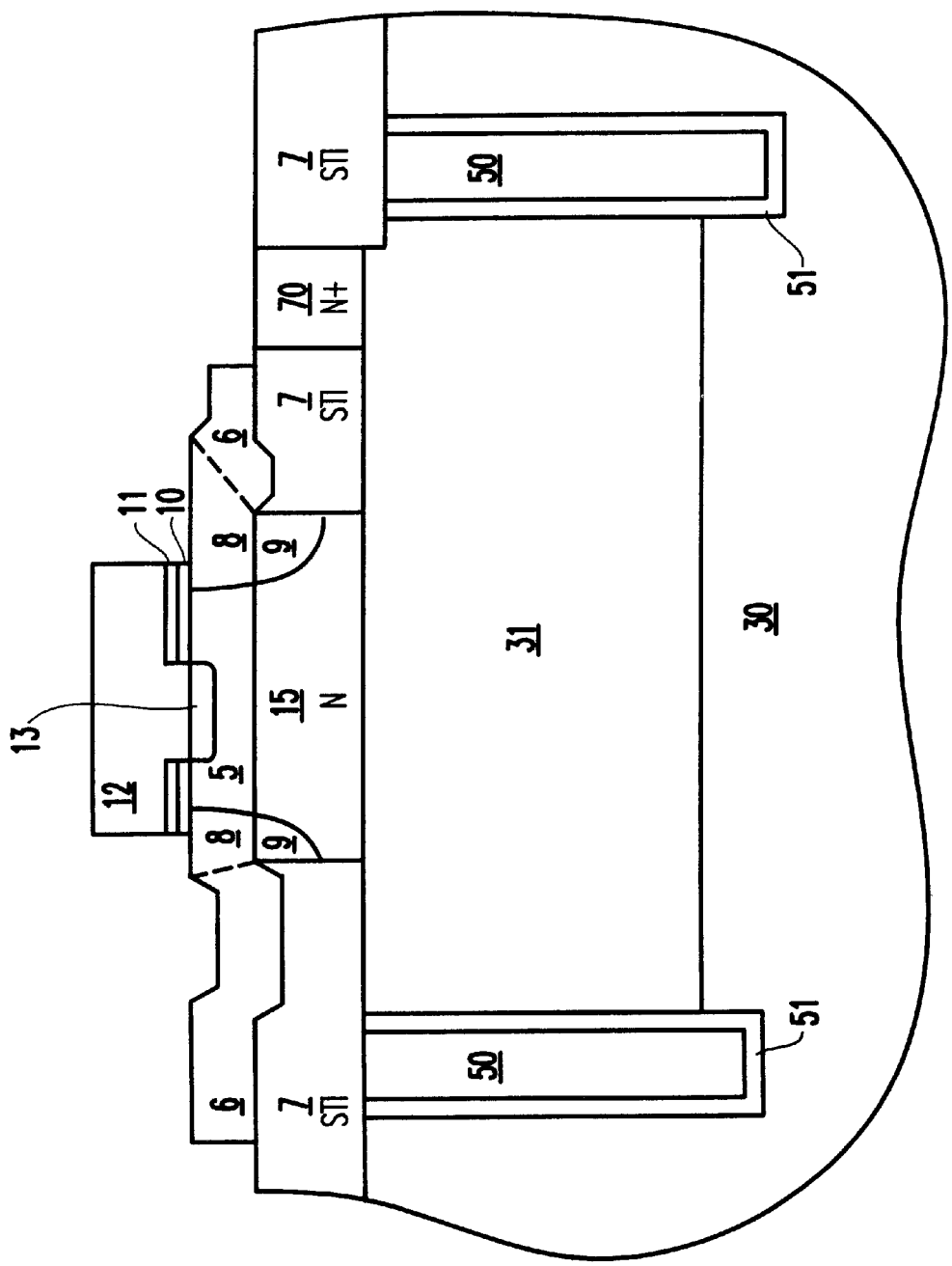
FIG. 16 is a schematic diagram of a partially-completed bipolar transistor according to a second embodiment of the invention.

In FIG. 15, an extrinsic base implant 170 is performed to dope regions 8 and 9. Using similar processing, a layer of polysilicon 12 is deposited and patterned, and the outer portions of the polysilicon layer 6 are removed, as shown in FIG. 16. The structure is then subjected to an annealing process. The polysilicon 12 is preferably doped with an impurity which diffuses to create diffusion region 13 within the single crystal silicon germanium carbon layer 5 during the annealing process, as shown in, FIG. 16. Alternatively, the diffusion region 13 could be formed in a separate, patterned, self-aligned implantation process before the polysilicon 12 is formed. In addition, during the annealing process, the dopant 8 (e.g., boron) will diffuse laterally (not horizontally) throughout the entire lateral dimension of the epitaxial layer 5, 6.

Figure 17:
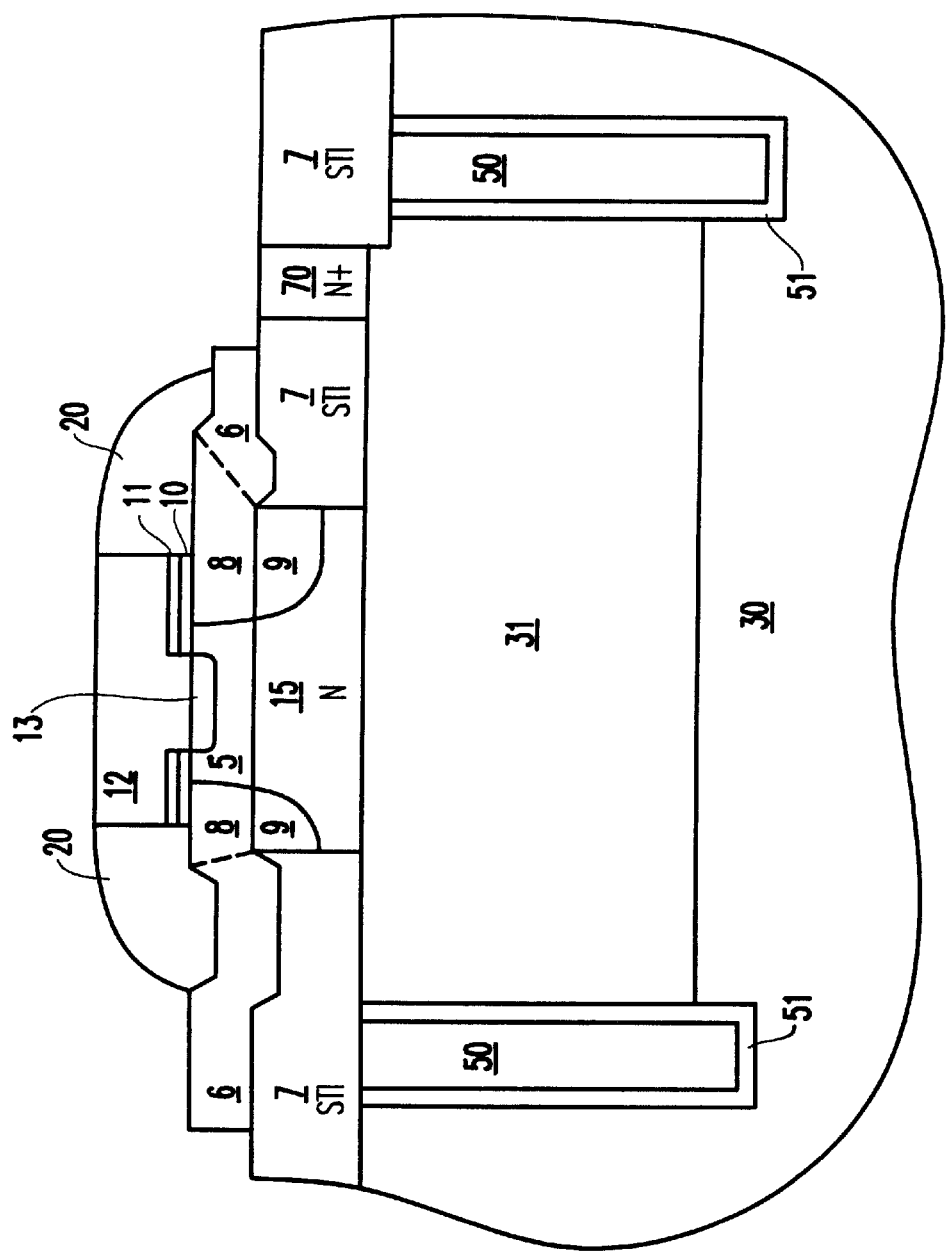
FIG. 17 is a schematic diagram of a partially-completed bipolar transistor according to a second embodiment of the invention.

To form the crevice cover 20, a layer of insulating material is again deposited over the partially-completed transistor structure, as shown in FIG. 17. Then, the insulator is etched in an anisotropic etching process that removes material from horizontal surfaces at a substantially faster rate than it removes material from vertical surfaces. This allows the insulator 20 to remain along the sidewall of the emitter 12, 11, 10. This process of forming a crevice cover 20 along the emitter still allows a sufficient portion of the silicide 4 to be formed, yet it also provides sufficient spacing between the silicide 4 and the base-to-emitter junction 22.

Figure 18:
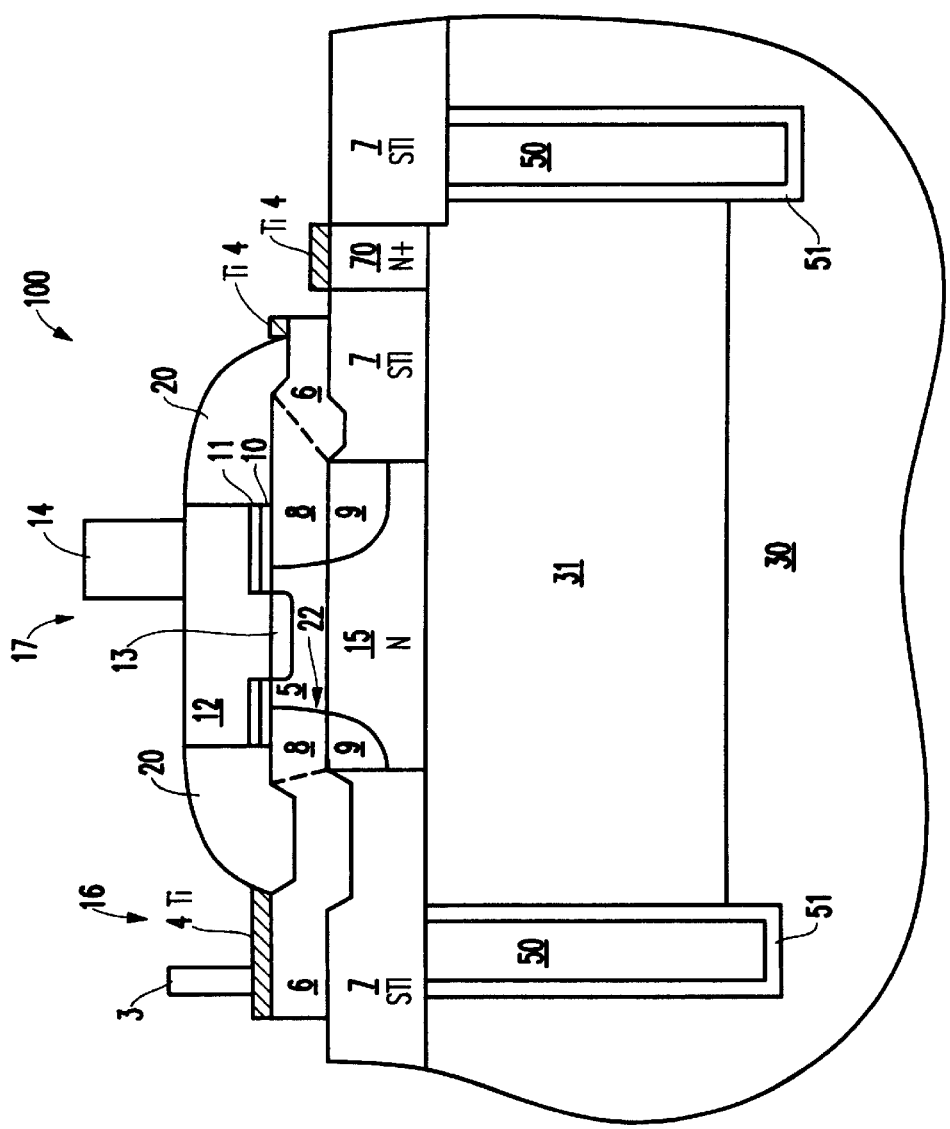
FIG. 18 is a schematic diagram of a partially-completed bipolar transistor according to a second embodiment of the invention.

After the emitter crevice cover 20 is formed, the silicide 4 is formed above the polysilicon 6 using conventional well-known silicide processing to decrease resistance of the polysilicon 6, as shown in FIG. 18. As discussed above, the emitter crevice cover 20 prevent the silicide 4 from being formed close to the base-to-emitter junction 22, thereby avoiding the ESD problems discussed above. To complete the structure, conductive contacts 3, 14 are again formed using well-known deposition and patterning processes.

FIG. 19 is a chart of two examples that show the decrease in electrostatic discharge (ESD) voltage as the sub-nominal silicide-to-emitter space increases. More specifically, as the silicide to emitter space decreases, the ESD robustness of the transistor also decreases. This is principally caused when the silicide infringes upon the emitter, as discussed above. In the examples shown in FIG. 19, the extrinsic base is aligned to the emitter junction and the extrinsic base implant is fixed relative to the emitter junction.

Figure 20:
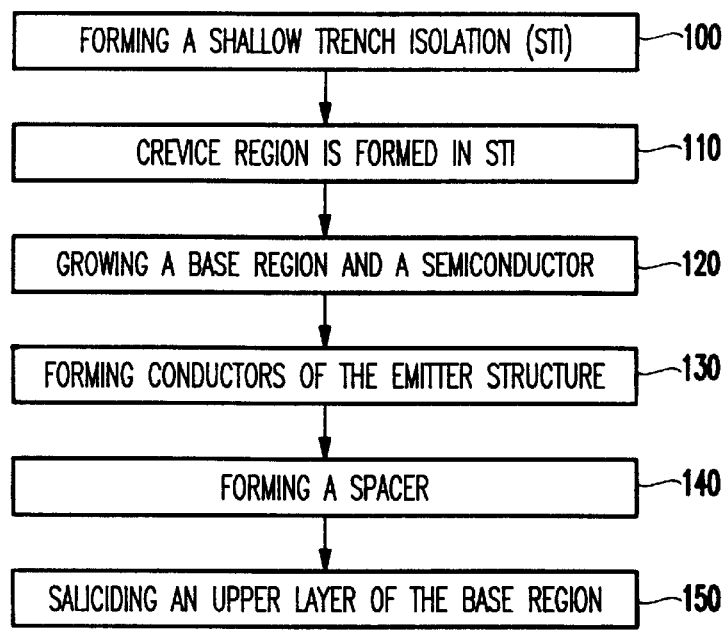
FIG. 20 is a flow diagram illustrating a method of the invention

FIG. 20 illustrates a flow chart of the bipolar transistor. The invention forms a shallow trench isolation (STI) (item 100) and forms a crevice region (item 110) in the STI. Simultaneously, the invention grows a base region and semiconductor (item 120). Then, the invention forms conductors of the emitter structure (item 130). Next, the invention forms a crevice cover (item 140) on the base region, and salicides an upper layer of the base region (item 150).

Therefore, the invention described above not only increases the spacing between the silicide 4 and the base-to-emitter region 22, but the invention also improves the suicide formation 4 to move the silicide 4 out of the crevice region 25 to further improve ESD robustness. Further, the silicide has a resistance that is independent of variations in the structure of the base or the emitter structure.

While the invention has been described in terms of preferred embodiments, those skilled in the art will recognize that the invention can be practiced with modification within the spirit and scope of the appended claims.

What is claimed is:

1. A bipolar transistor comprising:

a semiconductor substrate having a surface;

a shallow trench isolation (STI) in said surface, said STI having an edge;

a crevice region in said STI adjacent said STI edge;

a base region above said STI;

a silicide above said base region;

an emitter structure on said surface adjacent said base region; and a crevice cover between said emitter structure and said silicide, wherein said crevice cover maintains spacing between said emitter structure and said silicide.

2. A bipolar transistor as recited in claim 1, wherein said base region comprises polysilicon and said silicide comprises self-aligned metal silicide.

3. A bipolar transistor as recited in claim 1, wherein said spacing prevents substantial variation in resistance of said bipolar transistor.

4. A bipolar transistor as recited in claim 1, wherein said crevice cover extends over said crevice region and prevents said silicide from extending over said crevice region.

5. A bipolar transistor as recited in claim 1, wherein said base is spaced toward said emitter structure from said crevice region.

6. A bipolar transistor as recited in claim 1, wherein said silicide has a resistance independent of variations in said base and said emitter structure.

7. A bipolar transistor comprising:

a semiconductor substrate having a surface;

an insulator in said surface, a base region above said insulator, said base region having an upper silicide;

an emitter structure on said surface adjacent said base region; and a crevice cover between said emitter structure and said silicide, wherein said crevice cover maintains spacing between said emitter structure and said silicide.

8. A bipolar transistor as recited in claim 7, wherein said substrate comprises an epitaxial layer.

9. A bipolar transistor as recited in claim 8, wherein said substrate comprises silicon, and wherein said epitaxial layer comprises germanium.

10. A bipolar transistor as recited in claim 9, wherein said epitaxial layer comprises one of SiGe and SiGeC.

11. A bipolar transistor as recited in claim 7, wherein said insulator lies within a recessed surface of said substrate.

12. A bipolar transistor as recited in claim 7, wherein said spacing prevents substantial variation in resistance of said bipolar transistor.

13. A bipolar transistor as recited in claim 7, wherein said crevice cover extends over a junction between said base and said emitter and prevents said silicide from extending over said junction.

14. A method of forming a bipolar transistor comprising:

forming a shallow trench isolation (STI) in a substrate, said STI having an edge, such that a crevice region is formed in said STI adjacent said STI edge;

simultaneously growing a base region above said STI and a semiconductor of an emitter structure on said substrate adjacent said STI;

forming conductors of said emitter structure above said semiconductor;

forming a crevice cover on said base region adjacent said emitter structure; and saliciding an upper layer of said base region and adjacent said crevice cover to produce a silicide, wherein said crevice cover maintains spacing between said emitter structure and said silicide.

15. A method as recited in claim 14, wherein said simultaneously growing process produces polysilicon in said base region and said semiconductor in said emitter region.

16. A method as recited in claim 14, wherein said silicide comprises self-aligned metal silicide.

17. A method as recited in claim 14, wherein said spacing prevents substantial variation in resistance of said bipolar transistor.

18. A method as recited in claim 14, wherein said crevice cover extends over said crevice region and prevents said suicide from extending over said crevice region.

19. A method as recited in claim 14, wherein said simultaneously growing process comprises an epitaxial growth process of one of SiGe and SiGeC.

20. A method as recited in claim 14, wherein said silicide has a resistance independent of variations in said base and said emitter structure.

* * * * *